(12) United States Patent
Rolland

(10) Patent No.: US 9,404,944 B2
(45) Date of Patent: Aug. 2, 2016

(54) PACKAGE HAVING OPENING DETECTION

(75) Inventor: Patrick Rolland, Rueil Malmaison (FR)

(73) Assignee: SAGAMCOM ENERGY & TELECOM SAS, Rueil Malmaison (FR)

( * ) Notice: Subject to any disclaimer, the term of this patent is extended or adjusted under 35 U.S.C. 154(b) by 194 days.

(21) Appl. No.: 13/579,891

(22) PCT Filed: Feb. 24, 2011

(86) PCT No.: PCT/EP2011/000907
§ 371 (c)(1),
(2), (4) Date: Aug. 17, 2012

(87) PCT Pub. No.: WO2011/113519
PCT Pub. Date: Sep. 22, 2011

(65) Prior Publication Data
US 2012/0312704 A1  Dec. 13, 2012

(30) Foreign Application Priority Data
Mar. 15, 2010 (FR) ...................................... 10 51841

(51) Int. Cl.
*G01R 11/24* (2006.01)
*G01D 11/24* (2006.01)
(Continued)

(52) U.S. Cl.
CPC .............. *G01R 11/24* (2013.01); *G01D 11/245* (2013.01); *H02G 3/081* (2013.01); *F16B 41/005* (2013.01); *G01R 1/04* (2013.01); *G01R 1/22* (2013.01); *G01R 22/065* (2013.01)

(58) Field of Classification Search
CPC ........ G01R 1/04; G01R 11/04; G01R 22/065; G01R 1/22; G01R 11/24

USPC ............................................ 324/156, 207.11
See application file for complete search history.

(56) References Cited

U.S. PATENT DOCUMENTS 1,937,279 A * 11/1933 Leach ...................... G07C 1/20
340/306
2,051,293 A * 8/1936 Emens ................... G01R 11/04
220/664

(Continued)

FOREIGN PATENT DOCUMENTS

DE           492 979 C       3/1930
EP           0 447 615 A1    9/1991

(Continued)

OTHER PUBLICATIONS

Translation of EP 0447615.*

*Primary Examiner* — Jermele M Hollington
*Assistant Examiner* — Christopher McAndrew
(74) *Attorney, Agent, or Firm* — Muncy, Geissler, Olds & Lowe, P.C.

(57) ABSTRACT

A box comprising at least one portion that is closed by a movable cover and that contains an electronic detection circuit for detecting opening of the cover, the cover being provided with means for locking it in the closed position, said means comprising a screw that is mounted on the cover to pivot between a locking position and an unlocking position, and having an end provided with at least one tooth for meshing with teeth of a code wheel mounted to pivot in register with pads of the detection circuit, wherein the screw is mounted so that said end of the screw presents positioning with radial clearance relative to the box in such a manner that the pivoting of the code wheel has an amplitude that depends on the positioning of said end as authorized by the radial clearance.

8 Claims, 3 Drawing Sheets

(51) Int. Cl.
*H02G 3/08* (2006.01)
*G01R 22/06* (2006.01)
*G01R 1/04* (2006.01)
*G01R 1/22* (2006.01)
*F16B 41/00* (2006.01)

(56) References Cited

U.S. PATENT DOCUMENTS

| | | | | |
|---|---|---|---|---|
| 4,404,521 A | * | 9/1983 | Fennell | G01R 11/04 324/110 |
| 4,490,672 A | * | 12/1984 | Signorelli | G01R 11/24 116/319 |
| 4,901,007 A | * | 2/1990 | Sworm | G01R 11/04 324/110 |
| 4,977,482 A | * | 12/1990 | Langdon | H02B 1/03 324/156 |
| 5,621,311 A | * | 4/1997 | Kamiya | G01D 11/24 174/564 |
| 5,625,286 A | * | 4/1997 | Kamiya | G01R 1/04 324/156 |
| 5,789,672 A | * | 8/1998 | Rogers | G01D 11/26 324/156 |
| 7,315,442 B2 | * | 1/2008 | Robinson | G01R 11/04 324/156 |
| 7,342,507 B2 | * | 3/2008 | Jonker | G01R 21/133 324/156 |

FOREIGN PATENT DOCUMENTS

| | | |
|---|---|---|
| EP | 1 607 752 A1 | 9/1991 |
| EP | 0 965 848 A1 | 12/1999 |
| EP | 1 431 766 A1 | 6/2004 |

* cited by examiner

PACKAGE HAVING OPENING DETECTION

FIELD OF THE INVENTION

The present invention relates to a box that is at least partially closed by a movable cover. By way of example, such a box may contain electrical or electronic equipment such as an electricity meter.

BACKGROUND OF THE INVENTION

By way of example, electricity meters are known that have a box containing in particular the consumption measurement unit and the terminal strip for connecting the meter firstly to the public network and secondly to the user's electricity installation.

The portion of the box receiving the terminal strip is covered by a removable cover that enables technicians to access the terminal strip in order to connect the meter to the installation. The cover is held in position on the box by means of a quarter-turn screw held captive in the cover and turning between a locking position and an unlocking position.

If the user of the meter seeks to tamper with consumption measurement, it is necessary to have access to the terminal strip. In order to reveal that such access has occurred, orifices are provided in register with the head of the screw and the cover so as to pass a lead-sealed wire, with breakage of the seal enabling a technician to detect that the movable cover has been removed in non-authorized manner. However, technicians visit quite rarely and such visits are becoming rarer still as a result of the development of remote meter reading.

Suggestions have been made to place a switch in the box that is actuated by the screw being taken into the unlocking position, the switch serving to send a warning to the network in order to reveal tampering without it being necessary to take action on the meter. Nevertheless, that assumes that the tampering takes place while the meter is powered, which means that a fraudulent person could take advantage of a power cut, e.g. while work is being performed, for the purpose of gaining access to the terminal strip without being detected.

In order to remedy that drawback, an electricity meter is known having a box containing an electronic circuit for detecting opening of the cover when the emitter is not powered. The screw that is mounted on the cover to pivot between a locking position and an unlocking position has an end provided with at least one tooth for meshing with the teeth of a code wheel that is mounted to pivot in one direction only over pads of the detection circuit. The position of the code wheel relative to the pads of the detection circuit is stored each time the meter is powered in such a manner that a simple comparison serves to reveal whether or not the screw was moved during an interruption of the power supply to the meter. Nevertheless, it is possible for a fraudulent person to put the code wheel back into position by causing it to revolve through one complete revolution before the power supply is reestablished.

OBJECT AND SUMMARY OF THE INVENTION

An object of the invention is to provide means serving to improve the reliability with which the opening of a cover of the box is detected.

To this end, the invention provides a box comprising at least one portion that is closed by a movable cover and that contains an electronic detection circuit for detecting opening of the cover, the cover being provided with means for locking it in the closed position, said means comprising a screw that is mounted on the cover to pivot between a locking position and an unlocking position, and having an end provided with at least one tooth for meshing with teeth of a code wheel mounted to pivot in register with pads of the detection circuit, wherein the screw is mounted so that said end of the screw presents positioning with radial clearance relative to the box in such a manner that the pivoting of the code wheel has an amplitude that depends on the positioning of said end as authorized by the radial clearance.

Thus, the radial clearance gives rise to a random component in the extent to which the code wheel is driven, since the user does not know whether the code wheel has turned through one or more teeth. It is therefore not possible to bring the code wheel back to its initial position after removing the cover since it is not possible to determine how far the screw actually turned the code wheel.

Advantageously, a pawl is secured to the box in order to mesh with the teeth of the code wheel, and preferably, the screw and the box are fitted with means for emitting a plurality of audible clicks, which means are actuated by pivoting the screw between its two positions, and, more preferably, the means for emitting audible clicks comprise a spring blade secured to the screw or to the box to co-operate with portions in relief of the box or of the screw.

A pawl is generally noisy, unless special materials are used, and that might produce audible information about the turning of the code wheel. The means for emitting clicks serve to mask any noise that might be made by the pawl, and instead give information associated with the turning of the screw but not with the turning of the code wheel.

In an embodiment, the screw possesses a shank that is subdivided into a first portion having a drive head held captive in the cover and a second portion that forms the end provided with a tooth and that is held captive in the box, the two shank portions being provided with means enabling them to be releasably connected together in rotation, and the box presenting a pin on which the second shank portion is pivotally engaged with the radial clearance.

After the cover has been removed, and without having recourse to additional dismantling of the box, the user does not have access to the second shank portion nor to the code wheel.

BRIEF DESCRIPTION OF THE DRAWINGS

Other characteristics and advantages of the invention appear on reading the following description of a particular, non-limiting embodiment of the invention.

Reference is made to the accompanying drawings, in which.

MORE DETAILED DESCRIPTION

Figure 1:
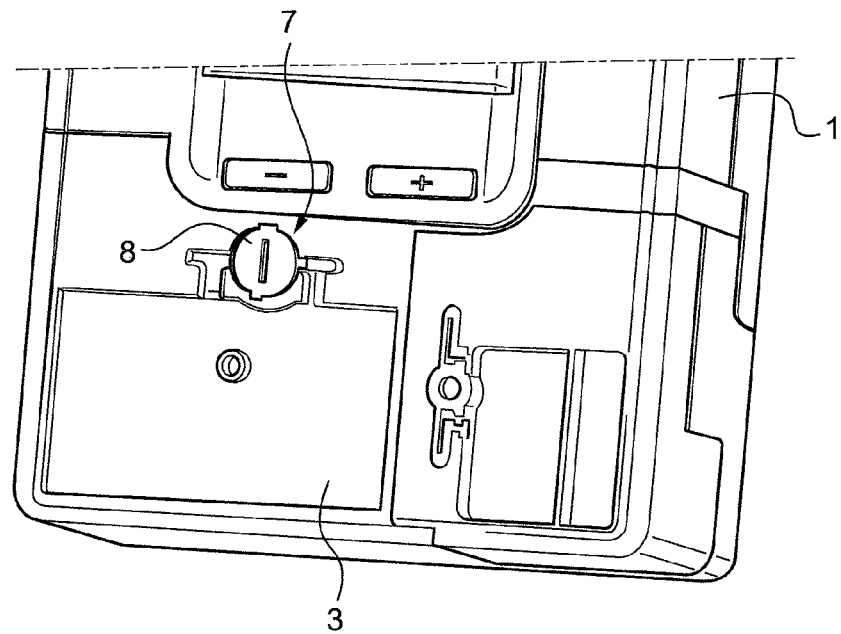
FIG. 1 is a fragmentary perspective view of an electricity meter including a box in accordance with the invention.
Figure 2:
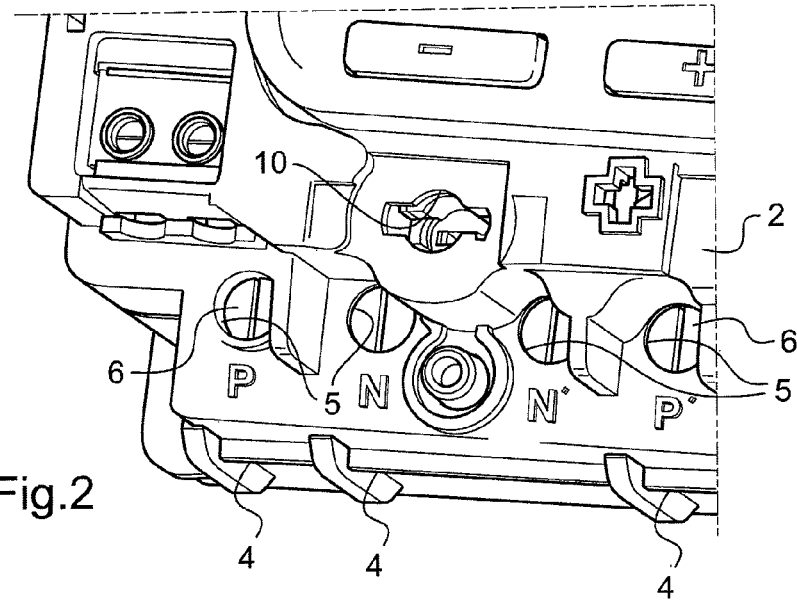
FIG. 2 is a view analogous to FIG. 1, showing the box after removing the top cover.
Figure 3:
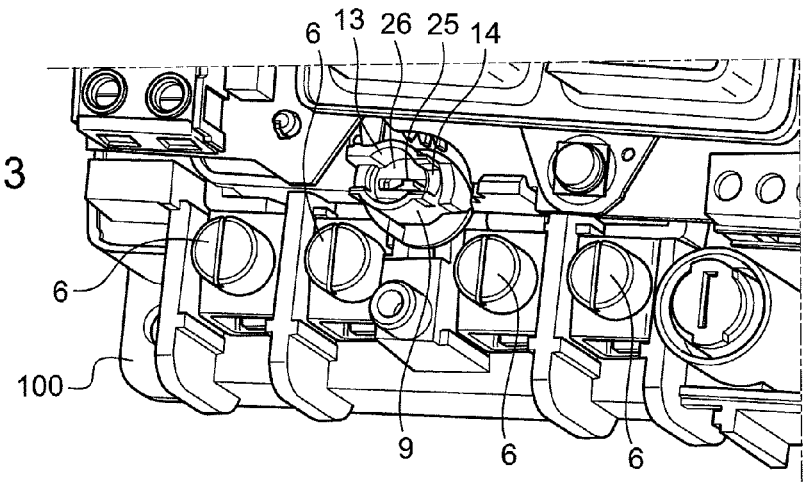
FIG. 3 is a view analogous to FIG. 1 showing the box after removing the bottom cover.
Figure 4:
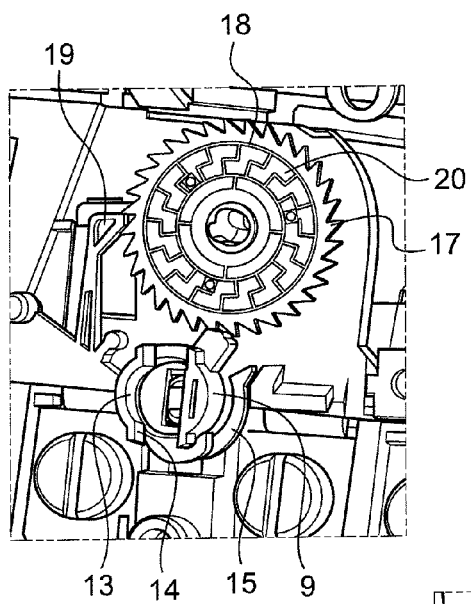
FIG. 4 is an enlarged perspective view of zone IV in FIG. 3.

The invention is described below in application to a meter that comprises an electrical unit and a terminal block 100 enabling an installation to be connected to the public electricity distribution network via the electrical unit. The electrical unit is itself known and comprises in particular a module for measuring the consumption of the installation and a circuit for detecting fraud, both themselves known.

The electricity unit and the terminal block 100 are enclosed in a box given overall reference 1, the box having a portion that is covered by a bottom cover 2, which is itself covered by a top cover 3. Said portion houses the terminal block 100 and the bottom cover 2 includes orifices 4 for passing cables and orifices 5 revealing the heads 6 of screws for clamping cables in the terminal block 100. The bottom cover 2 is covered by the top cover 3 that, in particular, masks the orifices 5 so as to prevent the cables from being disconnected. The top cover 3 is associated with means for detecting opening. These opening detection means are connected to the detection circuit forming part of the electrical unit.

The top cover 3 is fastened by means of a quarter-turn screw, given general reference 7, itself including in known manner a drive head 8 and a shank subdivided into a first portion and a second portion 9 (the only portion visible in the figures). This arrangement in two portions is conventional.

The head 8 and the first portion of the shank are secured to each other and pivotally mounted on the top cover 3, being held captive thereby. The first shank portion has a free end provided with two lugs extending symmetrically in lateral projection. The free end of the first shank portion is for inserting in an orifice 10 of the bottom cover 2. The orifice 10 has a circular outline with two symmetrical notches formed therein in such a manner that the free end of the first shank portion can pass through the orifice 10 when its lugs are in register with the notches, the screw 7 then being in an unlocking position. It can be understood that when the screw 7 is turned through 90° relative to the unlocking position, the lugs can no longer pass through the notches, with the screw 7 then being in a so-called "locking" position.

The second shank portion 9 is pivotally engaged about a pin 11 projecting from an inside portion 12 of the box 1 behind the bottom cover 2. The second shank portion 9 has a first end bearing against the inside portion 12 and a second end that extends in the vicinity of the orifice 10 and that is provided with a housing 13 for receiving the free end of the first shank portion. The housing 13 is defined laterally by a cylindrical wall having formed therein two notches 14 for receiving the lugs of the free end of the first shank portion, thereby constraining the two shank portions to turn together. The inside portion 12 has a rounded shape on which the first end of the second shank portion 9 rests.

The first end of the second shank portion 9 is also provided with a resilient arm 15 curving part of the way around said second end so as to have a free end provided with a tooth 16 for meshing with teeth 17 of a code wheel 18. The code wheel 18 is mounted on a portion of the box 1 to pivot relative to pads 20 of the detector circuit and is provided with contact tabs for making contact with said pads. A pawl 19 is secured to the box 1 to mesh with the teeth 17 of the code wheel 18. The operation of the detector circuit is itself known and is not described in detail herein.

According to a particular characteristic of the invention, the second shank portion 9 is mounted on the pin 11 so as to have a position that presents radial clearance relative to the box 1 in such a manner that when the screw 7 pivots between its two positions, the tooth 16 meshes with one or more of the teeth 17 of the code wheel 18 (in this example two or three of them) depending on the positioning of said end as authorized by the radial clearance. It can be seen that the pin 11 is much smaller in diameter than the inside diameter of the first end of the second shank portion 9.

Figure 5:
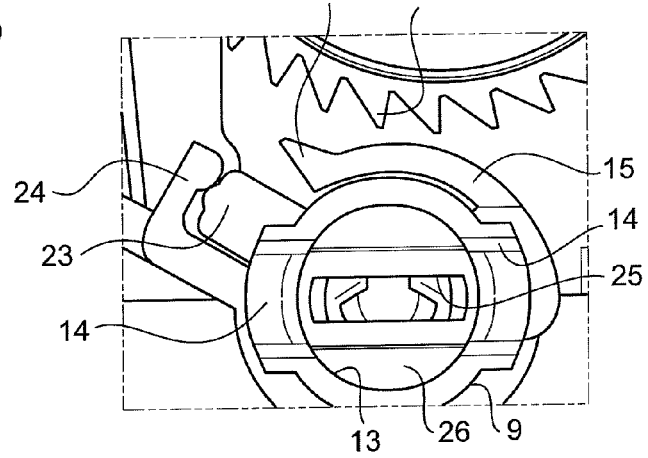
FIG. 5 is an enlarged view of a fragment of FIG. 4.
Figure 6:
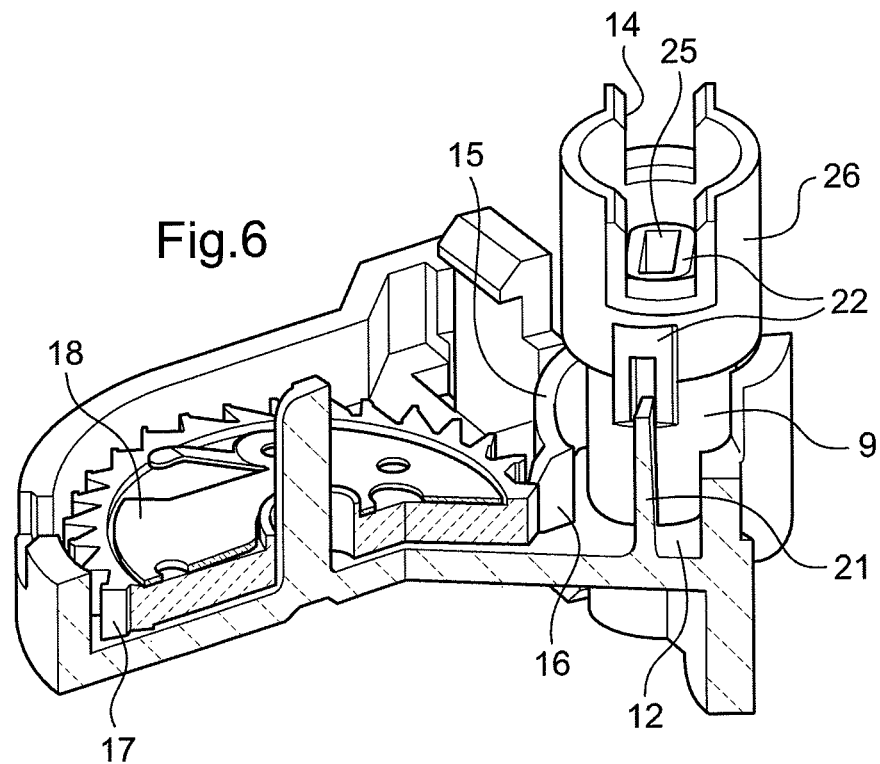
FIG. 6 is a perspective view seen from another angle and partially in section, showing said zone.
Figure 7:
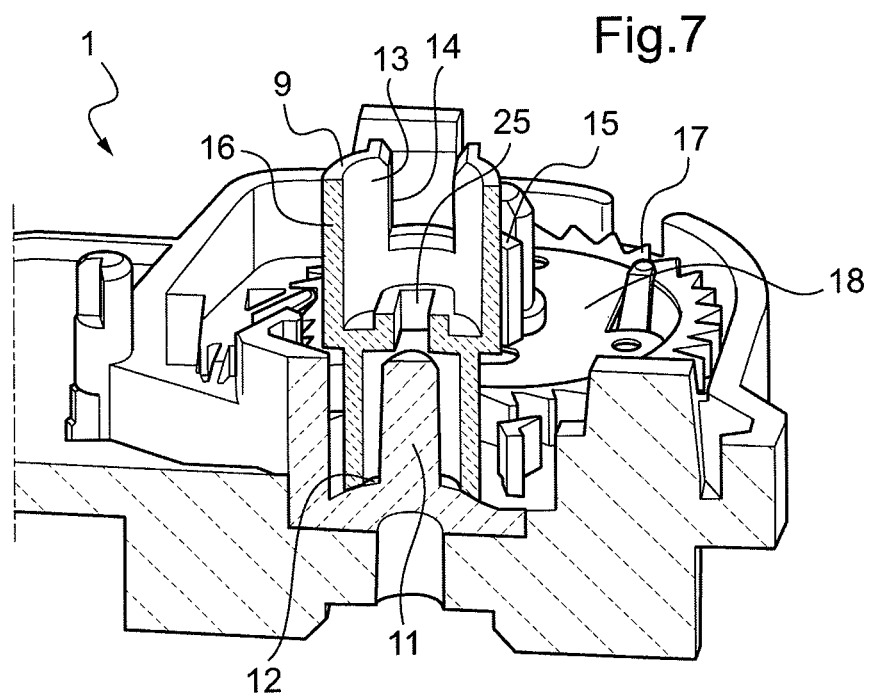
FIG. 7 is a perspective view of said zone, from yet another angle and in section on plane VI of FIG. 6.

Thus, turning the screw 7 between its locking and unlocking positions through the same amplitude can cause the code wheel 18 to pivot through amplitudes that are different depending on the proximity of the first end of the second shank portion 9 relative to the code wheel 18. If the first end of the second shank portion 9 is close to the code wheel 18, the tooth 16 will give rise to an angular movement equivalent to an angular sector corresponding to three teeth of the code wheel (see FIG. 5), whereas if the first end of the second shank portion 9 is remote from the code wheel 18, the tooth 16 will cause the code wheel 18 to move angularly by an amount that is equivalent to an angular sector corresponding to one tooth of the code wheel 18.

In order to avoid the impacts of the pawl 19 against the teeth 17 informing the user of the amplitude through which the code wheel 18 pivots, it is possible to use relatively soft plastics materials for the pawl 19 and the teeth 17 so as to deaden and diminish the impacts. Suitable plastics materials are constituted, for example, by polyamide or polyoxymethylene.

The stiffness of the arm 15 may also be adapted to reduce the clicking noise.

In the preferred embodiment of the invention, the screw and the box 1 are fitted with means for emitting a plurality of audible clicks that are actuated by pivoting the screw between its two positions. In this example, the audible click emitter means are constituted by a spring blade 21 having one end secured so as to extend perpendicularly projecting from the inside portion 12 of the box 1, and so as to have a free end suitable for co-operating with two portions in relief 22 secured to the second shank portion 9 of the screw 7 so as to extend parallel thereto over the path of the free end of the blade 21 when the screw 7 is moved between its two positions. It can be understood that the pivoting of the screw 7 between its two positions will cause two audible clicks to be emitted regardless of the amplitude through which the code wheel 18 pivots.

In order to make it easier to mount the screw 7, and more particularly to insert the free end of the first shank portion in the housing 13 of the second end of the second shank portion 9, the first end of the second shank portion 9 of the screw 7 is provided with a radially-projecting index 23 for passing into a resilient bracket 24 (FIG. 5) and for holding the second shank portion 9 in an assembly position (at 180° from the unlocking position) that enables the lugs of the first shank portion to be received in the notches 14. A socket 25 is also provided in the end wall 26 of the housing 13. The socket 25 is arranged to co-operate with a tool, here a flat screwdriver, so as to turn the second shank portion 9 through the bottom cover 2.

Naturally, the invention is not limited to the embodiments described, but covers any variant coming within the ambit of the invention as defined by the claims.

In particular, although the invention is described in an application to an electricity meter, the box of the invention may be used with other types of electrical, electronic, etc., equipment.

In a variant, the internal portion 12 against which the first end of the second shank portion 9 rests presents a shape that is plane.

The code wheel may be a ratchet wheel, or otherwise.

The means constraining the shank portions of the screw to rotate together may be different from those described, and may for example comprise dog-clutch elements. Alternatively, the screw may be made as a single piece.

The invention claimed is:

1. A box comprising at least one portion that is closed by a movable cover and that contains an electronic detection circuit for detecting opening of the cover, the cover being provided with means for locking it in the closed position, said means comprising a screw that is mounted on the cover to pivot between a locking position and an unlocking position, and having an end provided with at least one tooth for meshing with teeth of a code wheel mounted to pivot in register with pads of the detection circuit, wherein the screw is not coaxial with the code wheel and is mounted on a pin with radial clearance so that said end of the screw presents positioning relative to the box with the radial clearance allowing a variation of the radial distance between said end of the screw and the code wheel so that the pivoting of the code wheel has an amplitude that depends on the radial distance between said end of the screw and the code wheel, wherein a gap is provided between an inner circumferential surface of the screw and an outer circumferential surface of the pin such that the variation of the radial distance between the end of the screw and the code wheel is resulted from the gap between the inner circumferential surface of the screw and the outer circumferential surface of the pin.

2. The box according to claim 1, wherein a pawl is secured to the box in order to mesh with the teeth of the code wheel.

3. The box according to claim 2, wherein the screw and the box are fitted with means for emitting a plurality of audible clicks, which means are actuated by pivoting the screw between its two positions.

4. The box according to claim 3, wherein the means for emitting audible clicks comprise a spring blade secured to the screw or to the box to co-operate with portions in relief of the box or of the screw.

5. The box according to claim 1, wherein the tooth is secured to a resilient arm to extend radially and project from said end of the screw.

6. The box according to claim 1, wherein the screw includes a shank that is subdivided into a first portion having a drive head held captive in the cover and a second portion that forms the end provided with a tooth and that is held captive in the box, the two shank portions being provided with means enabling them to be releasably connected together in rotation, and the second shank portion is pivotally disposed on the pin with the radial clearance.

7. The box according to claim 6, wherein the second portion is provided with a socket arranged to co-operate with a tool so as to pass through the box after the cover has been removed and turn the second shank portion.

8. The box according to claim 6, wherein said end of the second shank portion of the screw is provided with a radially-projecting index for holding the screw in an assembly position.

\* \* \* \* \*